(12) United States Patent
Ning (10) Patent No.: US 11,869,615 B2
(45) Date of Patent: Jan. 9, 2024

(54) METHOD FOR READING AND WRITING AND MEMORY DEVICE

(71) Applicant: CHANGXIN MEMORY TECHNOLOGIES, INC., Hefei (CN)

(72) Inventor: Shuliang Ning, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 286 days.

(21) Appl. No.: 17/363,013

(22) Filed: Jun. 30, 2021

(65) Prior Publication Data

US 2021/0327531 A1 Oct. 21, 2021

Related U.S. Application Data

(63) Continuation of application No. PCT/CN2020/130389, filed on Nov. 20, 2020.

(30) Foreign Application Priority Data

Apr. 1, 2020 (CN) .......................... 202010249989.5

(51) Int. Cl.
*G11C 29/12* (2006.01)
*G11C 29/18* (2006.01)
(Continued)

(52) U.S. Cl.
CPC .............. *G11C 29/42* (2013.01); *G11C 29/18* (2013.01); *G11C 29/4401* (2013.01); *G11C 29/702* (2013.01)

(58) Field of Classification Search
CPC ..... G11C 29/42; G11C 29/18; G11C 29/4401; G11C 29/702
(Continued)

(56) References Cited

U.S. PATENT DOCUMENTS

| 5,841,711 A | 11/1998 | Watanabe |
| 5,996,096 A | 11/1999 | Dell et al. |

(Continued)

FOREIGN PATENT DOCUMENTS

| CN | 1832049 A | 9/2006 |
| CN | 101145372 A | 3/2008 |

(Continued)

OTHER PUBLICATIONS

State Intellectual Property Office of the People's Republic of China, First Office Action Issued in related Application No. 202010249668.5, dated Jan. 12, 2023, 8 pages.
(Continued)

*Primary Examiner* — Ly D Pham
(74) *Attorney, Agent, or Firm* — Kilpatrick Townsend & Stockton LLP (57) ABSTRACT

The embodiments provide a method for reading and writing and a memory device. The method for reading and writing includes: applying a read command to the memory device, the read command pointing to address information; reading data to be read out from a memory cell corresponding to the address information pointed to by the read command; and associating the address information pointed to by the read command with a spare memory cell if an error occurs in the data to be read out. The method for reading and writing provided by the present disclosure greatly improves reliability of the memory device and prolongs lifespan of the memory device.

13 Claims, 7 Drawing Sheets

(51) Int. Cl.
*G11C 29/42* (2006.01)
*G11C 29/44* (2006.01)
*G11C 29/00* (2006.01)

(58) Field of Classification Search
USPC ................................................... 365/185.09
See application file for complete search history.

(56) References Cited

U.S. PATENT DOCUMENTS

| | | | |
|---|---|---|---|
| 9,037,928 | B2 | 5/2015 | Kleveland et al. |
| 9,741,455 | B1 | 8/2017 | Park |
| 10,643,668 | B1 | 5/2020 | Poudyal et al. |
| 11,527,301 | B2 | 12/2022 | Ning et al. |
| 2002/0097613 | A1 | 7/2002 | Raynham |
| 2002/0169996 | A1 | 11/2002 | King et al. |
| 2003/0133336 | A1 | 7/2003 | Chen |
| 2003/0156469 | A1 | 8/2003 | Viehmann et al. |
| 2004/0003315 | A1 | 1/2004 | Lakhani et al. |
| 2006/0140027 | A1 | 6/2006 | Tominaga |
| 2007/0113155 | A1 | 5/2007 | Takahashi |
| 2007/0294570 | A1 | 12/2007 | Polisetti et al. |
| 2008/0181035 | A1* | 7/2008 | Kawasumi ......... G11C 29/4401 365/225.7 |
| 2010/0229033 | A1 | 9/2010 | Maeda et al. |
| 2010/0269000 | A1* | 10/2010 | Lee ..................... G11C 29/52 711/E12.001 |
| 2010/0332895 | A1 | 12/2010 | Billing et al. |
| 2010/0332950 | A1 | 12/2010 | Billing et al. |
| 2011/0119558 | A1 | 5/2011 | Koshiyama et al. |
| 2012/0166710 | A1 | 6/2012 | Ou |
| 2012/0254511 | A1 | 10/2012 | Yeh |
| 2013/0179724 | A1 | 7/2013 | Cordero et al. |
| 2014/0075265 | A1 | 3/2014 | Hung et al. |
| 2014/0376320 | A1* | 12/2014 | Loh ..................... G11C 29/76 365/200 |
| 2015/0019804 | A1* | 1/2015 | Nemazie ............. G11C 29/808 711/108 |
| 2015/0127972 | A1 | 5/2015 | Chun et al. |
| 2015/0143198 | A1 | 5/2015 | Chun et al. |
| 2015/0186198 | A1 | 7/2015 | Dong et al. |
| 2015/0293809 | A1 | 10/2015 | Liang et al. |
| 2015/0347254 | A1 | 12/2015 | Jones et al. |
| 2015/0363425 | A1 | 12/2015 | Li et al. |
| 2016/0147599 | A1 | 5/2016 | Kim |
| 2016/0357462 | A1 | 12/2016 | Nam et al. |
| 2016/0364153 | A1 | 12/2016 | Nam et al. |
| 2017/0123879 | A1 | 5/2017 | Donlin |
| 2017/0132075 | A1 | 5/2017 | Zastrow et al. |
| 2017/0139839 | A1 | 5/2017 | Ke |
| 2017/0262178 | A1 | 9/2017 | Hashimoto |
| 2017/0308433 | A1 | 10/2017 | Kwon et al. |
| 2017/0372799 | A1 | 12/2017 | Bacchus |
| 2018/0158535 | A1 | 6/2018 | Kim et al. |
| 2019/0129776 | A1 | 5/2019 | Hsiao et al. |
| 2019/0371391 | A1 | 12/2019 | Cha et al. |
| 2019/0377631 | A1 | 12/2019 | Hattori |
| 2019/0385693 | A1 | 12/2019 | Shin et al. |
| 2020/0004652 | A1 | 1/2020 | Niu et al. |
| 2021/0055981 | A1* | 2/2021 | Miller ................. G06F 11/0727 |
| 2021/0311836 | A1 | 10/2021 | Ning et al. |

FOREIGN PATENT DOCUMENTS

| | | |
|---|---|---|
| CN | 101593157 A | 12/2009 |
| CN | 101777013 A | 7/2010 |
| CN | 101908023 A | 12/2010 |
| CN | 101937374 A | 1/2011 |
| CN | 101937725 A | 1/2011 |
| CN | 102004698 A | 4/2011 |
| CN | 102063940 A | 5/2011 |
| CN | 102203740 A | 9/2011 |
| CN | 102592680 A | 7/2012 |
| CN | 103019873 A | 4/2013 |
| CN | 103247345 A | 8/2013 |
| CN | 103269230 A | 8/2013 |
| CN | 103309775 A | 9/2013 |
| CN | 103778065 A | 5/2014 |
| CN | 103839591 A | 6/2014 |
| CN | 103955430 A | 7/2014 |
| CN | 103955431 A | 7/2014 |
| CN | 104063186 A | 9/2014 |
| CN | 105723344 A | 6/2016 |
| CN | 105740163 A | 7/2016 |
| CN | 105788648 A | 7/2016 |
| CN | 105868122 A | 8/2016 |
| CN | 105893178 A | 8/2016 |
| CN | 106569742 A | 4/2017 |
| CN | 106776362 A | 5/2017 |
| CN | 107247563 A | 10/2017 |
| CN | 107402836 A | 11/2017 |
| CN | 107766173 A | 3/2018 |
| CN | 110673980 A | 1/2020 |
| TW | 201706842 A | 2/2017 |
| WO | 2012019475 A1 | 2/2012 |

OTHER PUBLICATIONS

State Intellectual Property Office of the People's Republic of China, First Office Action Issued in related Application No. 202010249989.5, dated Jan. 19, 2023, 10 pages.
State Intellectual Property Office of the People's Republic of China, First Office Action Issued in related Application No. 202010250023.3, dated Jan. 19, 2023, 12 pages.
State Intellectual Property Office of the People's Republic of China, First Office Action issued in Application No. 202010250011.0, dated Feb. 15, 2023, 9 pages.
State Intellectual Property Office of the People's Republic of China, First Office Action issued in Application No. 202010250426.8, dated Feb. 16, 2023, 12 pages.
European Patent Office, Office Action Issued in Application No. 20928300.1, dated Feb. 22, 2023, Germany, 11 pages.
European Patent Office, Extended European Search Report Issued in Application No. 20926358.1, dated Jul. 17, 2023, Germany, 7 pages.
United States Patent and Trademark Office, Non-Final office action issued in related U.S. Appl. No. 17/347,525 dated Aug. 2, 2023, total 9 pages.
United States Patent and Trademark Office, Non-Final office action issued in related U.S. Appl. No. 17/310,495 dated Jul. 31, 2023, total 14 pages.
United States Patent and Trademark Office, Non-Final office action issued in related U.S. Appl. No. 17/342,498 dated Jul. 19, 2023, total 15 pages.
State Intellectual Property Office of the People's Republic of China, Office Action Issued in Application No. 202010250008.9, Jul. 1, 8 pages.
United States Patent and Trademark Office, Non-Final office action issued in related U.S. Appl. No. 17/396,692 dated Jul. 7, 2023, total 10 pages.
European Patent Office, Summons to attend oral proceedings issued in Application No. 20928300.1, Nov. 15, 2023, Germany, 11 pages.

* cited by examiner

METHOD FOR READING AND WRITING AND MEMORY DEVICE

CROSS REFERENCE

This application is a continuation of PCT/CN2020/130389, filed Nov. 20, 2020, which claims priority to Chinese Patent Application No. 202010249989.5, titled "METHOD FOR READING AND WRITING AND MEMORY DEVICE" and filed on Apr. 1, 2020, the entire contents of which are incorporated herein by reference.

TECHNICAL FIELD

The present disclosure relates to the field of semiconductor memory technologies, and more particularly, to a method for reading and writing and a memory device.

BACKGROUND

Semiconductor memories are memory components for storing various data and information. With the increase in circuit complexity, various forms of memory devices are inevitably prone to produce defective or damaged memory cells during manufacturing or during use, resulting in reduced reliability and lifespan of the semiconductor memory devices.

Therefore, how to improve the reliability of the memory devices and prolong the lifespan of the memory devices has become an urgent problem to be solved at present.

SUMMARY

A technical problem to be solved by the present disclosure is to provide a method for reading and writing and a memory device to greatly improve the reliability of the memory device and prolong the lifespan of the memory device.

The present disclosure provides a method for reading and writing, which includes following steps. A read command is applied to the memory device, wherein the read command points to address information. Data to be read out is read from a memory cell corresponding to the address information pointed to by the read command. The address information pointed to by the read command is associated with a spare memory cell if an error occurs in the data to be read out, and data obtained by correcting the data to be read out is stored into the spare memory cell.

Further, the method for reading and writing also includes: generating an identification code configured for identifying the spare memory cell, wherein the address information pointed to by the read command is associated with the spare memory cell through the identification code.

Further, the method for reading and writing also includes: marking the address information pointed to by the read command as invalid if the error occurs in the data to be read out.

Further, if no error occurs in the data to be read out, the address information pointed to by the read command is marked as valid.

Further, address information not marked as invalid is initially set as valid.

Further, the step of reading data to be read out from a memory cell corresponding to the address information pointed to by the read command also includes: reading, from the memory cell corresponding to the address information pointed to by the read command, a first error correction code (ECC) corresponding to the data to be read out. A method for determining whether an error occurs in the data to be read out includes: decoding the first ECC to determine whether the error occurs in the data to be read out.

Further, a lookup table is provided, wherein address information of the memory cell and a numerical code corresponding to the address information are recorded in the lookup table. The numerical code is composed of a first type code and a second type code, wherein the first type code is configured for marking whether the address information is valid, and the second type code is configured for recording the identification code of the spare memory cell. If an error occurs in the data to be read out, the first type code of the numerical code corresponding to the address information pointed to by the read command is revised, in the lookup table, as an invalid marked value, and the second type code is revised as the identification code configured for identifying the spare memory cell.

Further, the method for reading and writing also includes: recording number of times of revising the second type code, and generating the corresponding identification code according to the number of times of revising the second type code.

Further, the numerical code has an initial value, wherein in the initial value, the first type code is a valid marked value, and the second type code is a meaningless code.

Further, a write command is applied to the memory device. A write operation is performed on a memory cell corresponding to address information pointed to by the write command if a mark of the address information pointed to by the write command is valid. If the mark of the address information pointed to by the write command is invalid, it is stopped performing the write operation on the memory cell corresponding to the address information pointed to by the write command, and the write operation is performed on the spare memory cell identified by the identification code corresponding to the address information pointed to by the write command.

Further, when a write command is applied to the memory device, the numerical code is looked up from the lookup table by taking the address information pointed to by the write command as an index.

Further, the step of performing a write operation on the memory cell corresponding to the address information pointed to by the write command also includes: forming a second ECC corresponding to data to be written in the write operation, and writing the second ECC together with the data to be written into the memory cell corresponding to the address information pointed to by the write command.

Further, after the applying a read command to the memory device, and before the reading data to be read out from a memory cell corresponding to the address information pointed to by the read command, the method for reading and writing also includes following steps. It is determined whether the address information pointed to by the read command is valid. A read operation is performed on the memory cell corresponding to the address information pointed to by the read command if the address information pointed to by the read command is valid. However, if the mark of the address information pointed to by the read command is invalid, it is stopped performing the read operation on the memory cell corresponding to the address information pointed to by the read command, and the read operation is performed on the spare memory cell identified by the identification code corresponding to the address information pointed to by the read command.

Further, the method for reading and writing also includes following steps. When the error occurs in the data to be read out, corrected data is stored into the spare memory cell if the data to be read out is corrected; and the data to be read out is stored into the spare memory cell if the data to be read out is not corrected.

The present disclosure also provides a memory device, which includes: a command receiving unit, configured to receive a read command or a write command; a memory cell, configured to correspond to address information pointed to by the read command or write command; a spare memory cell; an associating unit, configured to associate the address information with the spare memory cell; and an execution unit, configured to perform a read/write operation on the memory cell or the spare memory cell.

Further, the memory device also includes an identification code generating unit connected to the associating unit. The identification code generating unit is configured to generate an identification code configured for identifying the spare memory cell, and the associating unit associates the address information with the spare memory cell through the identification code.

Further, the associating unit is also configured to store mark information, wherein the mark information is configured for recording whether the address information is valid or invalid.

Further, the associating unit is a lookup table, wherein address information of the memory cell and a numerical code corresponding to the address information are recorded in the lookup table. The numerical code is composed of a first type code and a second type code, wherein the first type code is configured for marking whether the address information is valid, and the second type code is configured for recording the identification code of the spare memory cell. If an error occurs in the data to be read out, the first type code of the numerical code corresponding to the address information pointed to by the read command is revised, in the lookup table, as an invalid marked value, and the second type code is revised as the identification code configured for identifying the spare memory cell.

Further, the memory device also includes an ECC decoding unit, configured to decode a first ECC corresponding to data to be read out in the read operation and to form a second ECC corresponding to data to be written in the write operation.

Further, the execution unit is also connected to the associating unit, and the execution unit is configured to perform a read/write operation on the memory cell corresponding to the address information, or to stop performing the read/write operation on the memory cell corresponding to the address information, based on record of the associating unit.

Further, the memory device includes a logic layer and at least one memory layer. The command receiving unit, the associating unit and the execution unit are arranged in the logic layer, and the memory cell is arranged in the memory layer.

Advantages of the present disclosure are as below. When a user performs a read operation on the memory device, a memory cell with data error may be replaced by the spare memory cell in real time. That is, every time when the read operation is performed, the memory cell with data error may be replaced by the spare memory cell, such that when the user performs the read/write operation on the memory device, the read/write operation may be performed on the spare memory cell instead of the memory cell with data error, thereby avoiding data error or data loss. Therefore, the reliability of the memory device is greatly improved, and the lifespan of the memory device is prolonged.

DETAILED DESCRIPTION

Embodiments of a method for reading and writing and a memory device provided by the present disclosure are described below in detail with reference to the accompanying drawings.

A common method for improving reliability of a memory device includes: encoding data as an error correction code (ECC) before the data is written into the memory device, and simultaneously storing the data and the ECC into the memory device. When reading, both the data and the ECC are read simultaneously, and the ECC is decoded to restore data where an error likely occurs.

However, it is found that the ECC can only correct data when the data is read out, and in a memory there still exists a memory cell with data error. In a subsequent data storage process, if at least one memory cell with data error reoccurs in a memory segment corresponding to the above memory cell with data error, in this memory segment there may exist at least two memory cells with data error. However, the ECC will be unable to correct the error, causing this memory segment to be unserviceable, or even causing the memory device to be unserviceable, thereby having a negative effect on the reliability and lifespan of the memory device.

By study, it is found that when a user uses the memory device, it may be avoided performing a read/write operation on the memory cell with data error (i.e., an invalid memory cell) by differentiating the memory cell with data error in real time and replacing the memory cell with data error by a spare memory cell, which can greatly improve the reliability of the memory device and prolong the lifespan of the memory device. Therefore, the present disclosure provides a method for reading and writing, which can differentiate a memory cell with data error in real time, and replace the memory cell with data error by a spare memory cell.

Figure 1:
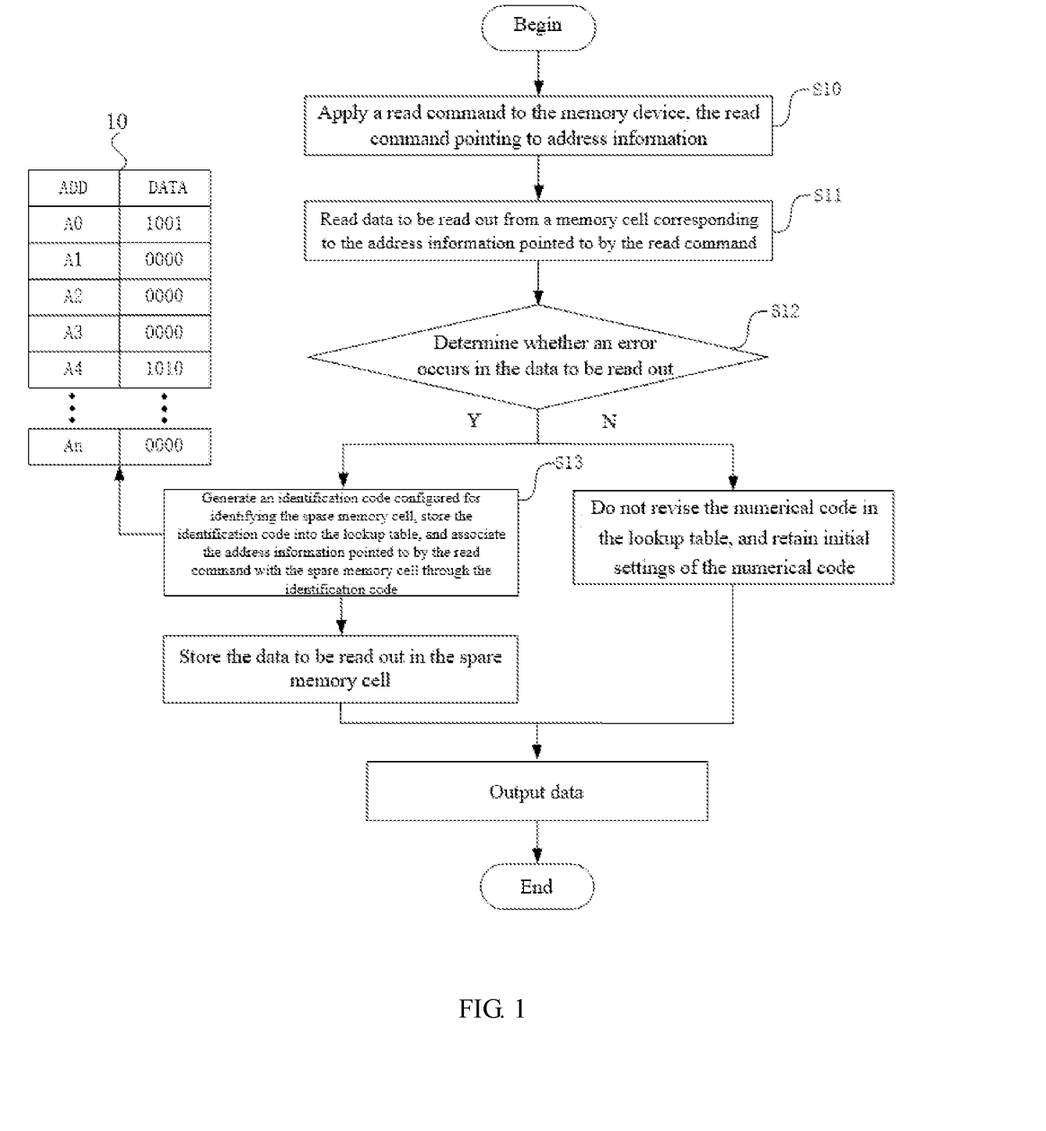
FIG. 1 is a schematic flow diagram of a method for reading and writing according to a first embodiment of the present disclosure.

In some embodiments, with reference to FIG. 1, a schematic flow diagram of the method for reading and writing according to the first embodiment of the present disclosure is illustrated, and the method for reading and writing includes following steps.

In Step S10, a read command is applied to the memory device, wherein the read command points to address information. For example, the address information pointed to by the read command is denoted by A0.

In Step S11, data to be read out is read from a memory cell corresponding to the address information pointed to by the read command. For example, data to be read out is read from a memory cell corresponding to the address information A0.

In Step S12, it is determined whether an error occurs in the data to be read out.

If an error occurs in the data to be read out, this means that the memory cell is invalid. In this case, the address information pointed to by the read command is associated with the spare memory cell, and the data to be read out is stored into the spare memory cell. That is, an invalid memory cell is replace by the spare memory cell to improve the reliability of the memory device. Further, in another embodiment of the present disclosure, when the error occurs in the data to be read out, if the data to be read out is corrected, the corrected data instead of the data to be read out is stored into the spare memory cell.

Further, to associate the address information pointed to by the read command with the spare memory cell, in this embodiment, the method for reading and writing also includes Step S13. In Step S13, an identification code configured for identifying the spare memory cell is generated, the identification code is stored into the lookup table 10, and the address information pointed to by the read command is associated with the spare memory cell through the identification code. It is to be understood that different spare memory cells correspond to different identification codes to ensure that the spare memory cells associated with the address information pointed to by the read command are not repetitive, thereby avoiding data storage error.

In this embodiment, a lookup table 10 is provided, wherein the lookup table 10 is provided with an address information bar ADD and a numerical bar DATA.

All address information of the memory device is prestored in the address information bar ADD, such as A0, A1, A2, A3, A4, A5, A6 . . . An. The amount of the address information may be set based on actual situations of the memory device.

The numerical bar DATA is configured for storing a numerical code corresponding to the address information. Each of the address information corresponds to one numerical code. The numerical code at least includes an identification code configured for identifying the spare memory cell or a meaningless code.

In this embodiment, the numerical code is composed of a first type code and a second type code.

The first type code is configured for marking whether the address information is valid. For example, the first type code is 0 or 1, wherein 0 represents a valid marked value indicating that the address information is valid, and 1 represents an invalid marked value indicating that the address information is invalid.

In some embodiments, if an error occurs in the data to be read out, this means that the memory cell is invalid. In this case, the address information pointed to by the read command is marked as invalid. For example, if an error occurs in the data to be read out read from the memory cell corresponding to the address information A0 pointed to by the read command, the first type code of the numerical code corresponding to the address information A0 pointed to by the read command is marked as the invalid marked value 1 in the lookup table 10. If the error occurs in the data to be read out read from the memory cell corresponding to the address information A4 pointed to by the read command, the first type code of the numerical code corresponding to the address information A4 pointed to by the read command is marked as the invalid marked value 1 in the lookup table 10.

The second type code is configured for recording the identification code of the meaningless code. The second type code may be a multi-bit code, which may be determined according to number of the spare memory cells. For example, the second type code is a three-bit code, which may be 000, 001, 010, 100, 101, 011, 110, 111, and so on.

When the first type code is the invalid marked value indicating that the address information is invalid (for example, when the first type code is 1), the second type code is the identification code, the address information pointed to by the read command is associated with the spare memory cell through the identification code, and data obtained by correcting the data to be read out is stored into the spare memory cell. For example, if the first type code of the numerical code corresponding to the address information A0 is the invalid marked value 1, the second type code 001 of the numerical code corresponding to the address information A0 is an identification code that can identify a spare memory cell, the address information pointed to by the read command is associated with the spare memory cell through the identification code 001, and data obtained by correcting the data to be read out is stored into the spare memory cell identified by the identification code 001. If the first type code of the numerical code corresponding to the address information A4 is the invalid marked value 1, the second type code 010 of the numerical code corresponding to the address information A4 is an identification code that can identify a spare memory cell, the address information pointed to by the read command is associated with the spare memory cell through the identification code 010, and data obtained by correcting the data to be read out is stored into the spare memory cell identified by the identification code 010.

If no error occurs in the data to be read out, this means that the memory cell is valid. In this case, in the lookup table 10, the numerical code corresponding to the address information pointed to by the read command is the valid marked value, and the second type code is a meaningless code. The meaningless code is configured for filling numerical digits, and is not configured for identifying any one spare memory cell.

In some embodiments, in this embodiment, if no error occurs in the data to be read out read from the memory cell corresponding to the address information A1 pointed to by the read command, the first type code of the numerical code corresponding to the address information A1 pointed to by the read command is marked as the valid marked value 0 in the lookup table 10, and the second type code is a meaningless code 000. If no error occurs in the data to be read out read from the memory cell corresponding to the address information A2 pointed to by the read command, the first type code of the numerical code corresponding to the address information A2 pointed to by the read command is marked as the valid marked value 0 in the lookup table 10, and the second type code is the meaningless code 000. In this embodiment, the meaningless code is denoted by a numerical value 000. In other embodiments of the present disclosure, the meaningless code may also be denoted by other numerical values.

In the present disclosure, there are following two processing modes for setting the first type code of the numerical code corresponding to the address information pointed to by the read command as the valid marked value.

The first processing modes for setting the first type code of the numerical code corresponding to the address information pointed to by the read command as the valid marked value is as below. The numerical codes corresponding to all the address information are initially set as a combination of the valid marked value and the meaningless code in the lookup table. If no error occurs in the data to be read out, the numerical code in the lookup table is not revised, i.e., initial settings of the numerical code are retained. For example, if no error occurs in the data to be read out read from the memory cell corresponding to the address information A1 pointed to by the read command, the initial settings of the numerical code corresponding to the address information A1 pointed to by the read command are retained in the lookup table 10. That is, the initial settings of the numerical code are not revised. In this embodiment, the first processing mode is adopted.

In the first processing mode, the first type code of the numerical code corresponding to the address information pointed to by the read command is not revised from the valid marked value to the invalid marked value in the lookup table 10 unless an error occurs in the data to be read out read from the memory cell corresponding to the address information pointed to by the read command. In this case, the second type code of the numerical code is revised from the meaningless code to the identification code. For example, if an error occurs in the data to be read out read from the memory cell corresponding to the address information A0 pointed to by the read command, the first type code of the numerical code corresponding to the address information A0 pointed to by the read command is revised from the valid marked value to the invalid marked value in the lookup table 10, and the second type code of the numerical code is revised from the meaningless code to the identification code.

Further, in the first processing mode, when the memory device is powered on or shipped out of factory, the numerical codes corresponding to all the address information are initially set as a combination of the valid marked value and the meaningless code. It is to be understood that in the use of the memory device, after performing the read/write operation on the memory device for many times, in the lookup table, the numerical code corresponding to the address information likely is a combination of the invalid marked value and the identification code, or likely is a combination of the valid marked value and the meaningless code. Therefore, when a read command is applied to the memory device, the lookup table obtained after a previous read/write operation is performed is an initial lookup table of the current read operation, and the numerical code corresponding to the address information of the memory cell after the previous read/write operation is recorded in the initial lookup table, wherein the numerical code is an initial numerical code of the current read operation, and the numerical code likely is a combination of the invalid marked value and the identification code, or likely is a combination of the valid marked value and the meaningless code. If an error occurs in the data to be read out, the numerical code corresponding to the address information pointed to by the read command is revised as a combination of the invalid marked value and the meaningless code in the lookup table 10.

Further, the method for reading and writing provided by the present disclosure also includes following Step S14. In Step S14, number of times of revising the second type code is recorded, and the corresponding identification code is generated according to the number of times of revising the second type code. In some embodiments, if a data error occurs in the address information pointed to by the read command, the second type code needs to be revised as the identification code to associate the address information with a spare memory cell through the identification code. To avoid the spare memory cells associated with different address information to be repetitive, different identification codes may be generated according to the number of times of revising the second type code, i.e., different address information corresponds to different identification codes. In this way, different address information is associated with different spare memory cells. For example, when the number of times of revising the second type code is 0, the identification code is 001. When the number of times of revising the second type code is 1, the identification code is 010. When the number of times of revising the second type code is 2, the identification code is 100 . . . , and so on. The corresponding identification code is generated according to the number of times of revising the second type code.

The second processing modes for setting the first type code of the numerical code corresponding to the address information pointed to by the read command as the valid marked value is as below. If no error occurs in the data to be read out, the first type code of the numerical code corresponding to the address information pointed to by the read command is marked as the valid marked value in the lookup table 10, and a position of the second type code is filled with the meaningless code. For example, if no error occurs in the data to be read out read from the memory cell corresponding to the address information A1 pointed to by the read command, the first type code of the numerical code corresponding to the address information A1 pointed to by the read command is marked as the valid marked value 0 in the lookup table 10, and the position of the second type code is filled with the meaningless code.

In another embodiment of the present disclosure, the numerical code may be only composed of the second type code. That is, the numerical code only includes the identification code configured for identifying the spare memory cell or the meaningless code. If an error occurs in the data to be read out, this means that the memory cell is invalid. In this case, the numerical code corresponding to the address information corresponding to the memory cell is the identification code. If no error occurs in the data to be read out, this means that the memory cell is valid. In this case, the numerical code corresponding to the address information corresponding to the memory cell is the meaningless code. Further, the present disclosure also provides a method for determining whether an error occurs in the data to be read out. In some embodiments, the step of reading data to be read out from a memory cell corresponding to the address information pointed to by the read command further includes: reading, from the memory cell corresponding to the address information pointed to by the read command, a first error correction code (ECC) corresponding to the data to be read out. For example, number of bits of data read from the memory cell corresponding to the address information pointed to by the read command is 64b+8b, wherein 64b represents the number of bits of the data to be read out, and 8b represents the number of bits of the first ECC. According to a corresponding algorithm, the first ECC is decoded to restore data where an error likely occurs. The algorithm belongs to the existing technologies, and thus is not to be described in detail. Therefore, it may be determined whether an error occurs in the data to be read out by decoding the first ECC.

The present disclosure enumerates a method for determining whether an error occurs in the data to be read out by decoding the first ECC. This method includes following steps. The data to be read out is re-encoded to form a new ECC, and an XOR comparison is made between the new ECC and the first ECC. If the new ECC is consistent with the first ECC in each bit, this means that no error occurs in the data to be read out, and the memory cell is valid. In this case, the lookup table 10 is not revised, and the first type code of the numerical code corresponding to the address information corresponding to the memory cell is the valid marked value. If the new ECC is inconsistent with the first ECC, this means that an error occurs in the data to be read out, and the memory cell is invalid. In this case, the first type code of the numerical code corresponding to the address information pointed to by the read command is revised the invalid marked value in the lookup table 10.

If no error occurs in the data to be read out, the data to be read out is used as output data of the memory device. If an error occurs in the data to be read out, the first ECC may be employed to correct the data to be read out, the corrected data is used as the output data of the memory device, and the corrected data is stored into the corresponding spare memory cell.

According to the method for reading and writing provided by the present disclosure, when a user performs a read/write operation on the memory device, a memory cell with data error is differentiated in real time and is replaced by the spare memory cell in real time. That is, every time when the read operation is performed, the memory cell with data error may be replaced by the spare memory cell, such that when the user performs the read/write operation on the memory device subsequently, the read/write operation may be performed on the spare memory cell instead of the memory cell with data error. Therefore, the reliability of the memory device can be greatly improved, and the lifespan of the memory device can be prolonged.

The method for reading and writing provided by the present disclosure also provides a second embodiment. After applying a read command to the memory device, and before reading data to be read out from a memory cell corresponding to the address information pointed to by the read command, the method for reading and writing also includes a step of determining whether the address information pointed to by the read command is valid. In some embodiments, with reference to FIG. 2, a schematic flow diagram of the method for reading and writing according to the second embodiment of the present disclosure is illustrated.

Figure 2:
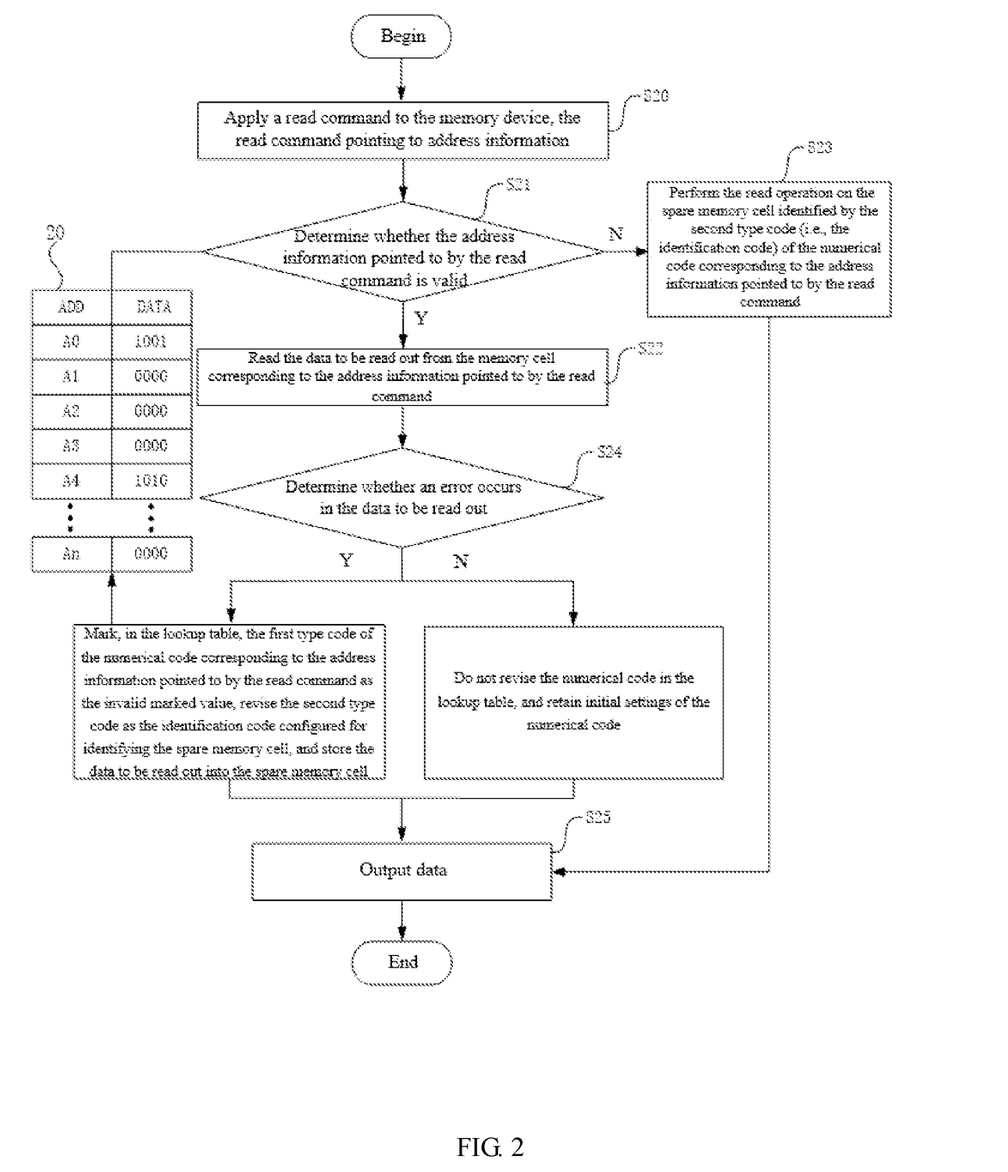
FIG. 2 is a schematic flow diagram of a method for reading and writing according to a second embodiment of the present disclosure.

In Step S20, a read command is applied to the memory device, wherein the read command points to address information.

In Step S21, it is determined whether the address information pointed to by the read command is valid.

In some embodiments, when applying a read command to the memory device, the mark is looked up from the lookup table 20 by taking the address information pointed to by the read command as an index. In the lookup table 20, if the first type code of the numerical code corresponding to the address information pointed to by the read command is the valid marked value, this means that the address information pointed to by the read command is valid. However, if the first type code of the numerical code corresponding to the address information pointed to by the read command is the invalid marked value, this means that the address information pointed to by the read command is invalid.

For example, if the address information pointed to by the read command is the address information A1, the mark is looked up from the lookup table 20 by taking the address information A1 pointed to by the read command as an index. In the lookup table 20, if the first type code of the numerical code corresponding to the address information A1 pointed to by the read command is the valid marked value 0, this means that the address information A1 pointed to by the read command is valid.

For another example, the address information pointed to by the read command is the address information A4. The mark is looked up from the lookup table 20 by taking the address information A4 pointed to by the read command as the index. In the lookup table 20, if the first type code of the numerical code corresponding to the address information A4 pointed to by the read command is the invalid marked value 1, this means that the address information A4 pointed to by the read command is invalid.

If the address information pointed to by the read command is valid, the read operation is performed on the memory cell corresponding to the address information pointed to by the read command, i.e., Step S22 is performed. For example, in the lookup table 20, if the first type code of the numerical code corresponding to the address information A1 pointed to by the read command is the valid marked value 0, this means that the address information A1 pointed to by the read command is valid. In this case, the read operation is performed on the memory cell corresponding to the address information A1 pointed to by the read command, i.e., Step S22 is performed. In Step S22, the address information pointed to by the read command is the address information A1.

Further, if the first type code of the numerical code corresponding to the address information pointed to by the read command is the valid marked value, the second type code of the numerical code is not identified.

However, if the address information pointed to by the read command is invalid, i.e., in the lookup table 20, if the first type code of the numerical code corresponding to the address information pointed to by the read command is the invalid marked value, this means that the memory cell corresponding to the address information pointed to by the read command is invalid. In this case, it is stopped performing the read operation on the memory cell corresponding to the address information pointed to by the write command, and Step S23 is performed. For example, in the lookup table 20, if the first type code of the numerical code corresponding to the address information A4 pointed to by the read command is the invalid marked value 1, it is stopped performing the read operation on the memory cell corresponding to the address information A4 pointed to by the write command, and Step S23 is performed.

Further, in another embodiment of the present disclosure, the numerical code also may be only composed of the second type code. That is, the numerical code only includes the identification code configured for identifying the spare memory cell or the meaningless code. When applying a read command to the memory device, the numerical code is looked up from the lookup table 20 by taking the address information pointed to by the read command as an index. In the lookup table 20, if the numerical code corresponding to the address information pointed to by the read command is the meaningless code, this means that the memory cell corresponding to the address information pointed to by the read command is valid. In this case, the read operation is performed on the memory cell. If the numerical code corresponding to the address information pointed to by the read command is the identification code, this means that the memory cell corresponding to the address information pointed to by the read command is invalid. In this case, the read operation is performed on the spare memory cell corresponding to the identification code.

In Step S22, the data to be read out is read from the memory cell corresponding to the address information pointed to by the read command. For example, the data to be read out is read from the memory cell corresponding to the address information A1 pointed to by the read command. This step is the same as Step S11 in the first embodiment.

In Step S23, the read operation is performed on the spare memory cell identified by the second type code (i.e., the identification code) of the numerical code corresponding to the address information pointed to by the read command. For example, in the lookup table 20, if the first type code of the numerical code corresponding to the address information A4 pointed to by the read command is the invalid marked value 1, the read operation is performed on the spare memory cell identified by the second type code 101 of the numerical code corresponding to the address information A4 pointed to by the read command. Step S25 is performed after Step S23 is performed.

In Step S24, it is determined whether an error occurs in the data to be read out. This step is the same as Step S12 in the first embodiment. If an error occurs in the data to be read out, in the lookup table 20, the first type code of the numerical code corresponding to the address information pointed to by the read command is marked as the invalid marked value, the second type code is revised as the identification code configured for identifying the spare memory cell, and the data to be read out is stored into the spare memory cell. If no error occurs in the data to be read out, in the lookup table 20, the first type code of the numerical code corresponding to the address information pointed to by the read command is revised the valid marked value, the second type code is filled with the meaningless code, or the lookup table is not revised when all the numerical codes in the lookup table 20 are initially set as a combination of the valid marked value and the meaningless code. In this embodiment, the mode of not revising the lookup table is adopted. Further, in another embodiment of the present disclosure, when the error occurs in the data to be read out, if the data to be read out is corrected, the corrected data instead of the data to be read out is stored into the spare memory cell. In Step S25, data is outputted. In this step, the outputted data may be the data stored in the spare memory cell, or may be corrected or uncorrected data to be read out in the memory cell.

It is to be noted that in another embodiment, after Step S23 is performed, it may be continued to determine whether an error occurs in data read out from a corresponding spare memory cell. The data is outputted if no error occurs in the data read out. If an error occurs in the data read out, a numerical value of the second type code corresponding to the address information pointed to by the read command is changed, the address information pointed to by the read command is associated with another spare memory cell, and the data to be read out or the corrected data to be read out may be stored into the new spare memory cell.

In the second embodiment, after a read command is applied to the memory device, it is determined whether the address information pointed to by the read command is valid, such that the read command may be selectively executed on the address information pointed to by the read command. Thus, the reliability of the memory device can be improved. In addition, after the data to be read out is read out, it may be selected whether to mark the address information of the memory cell according to a fact whether an error occurs in the data to be read out. The memory cell with data error is replaced by the spare memory cell if an error occurs in the data to be read out. Furthermore, the corrected data is stored into the spare memory cell to provide a basis for a subsequent read/write operation. In this way, the reliability of the memory device is greatly improved, and the lifespan of the memory device is prolonged.

The method for reading and writing provided by the present disclosure also provides a third embodiment. In the third embodiment, a write operation is performed on the memory device. In some embodiments, with reference to FIG. 3, a schematic flow diagram of the method for reading and writing according to the third embodiment of the present disclosure is illustrated.

Figure 3:
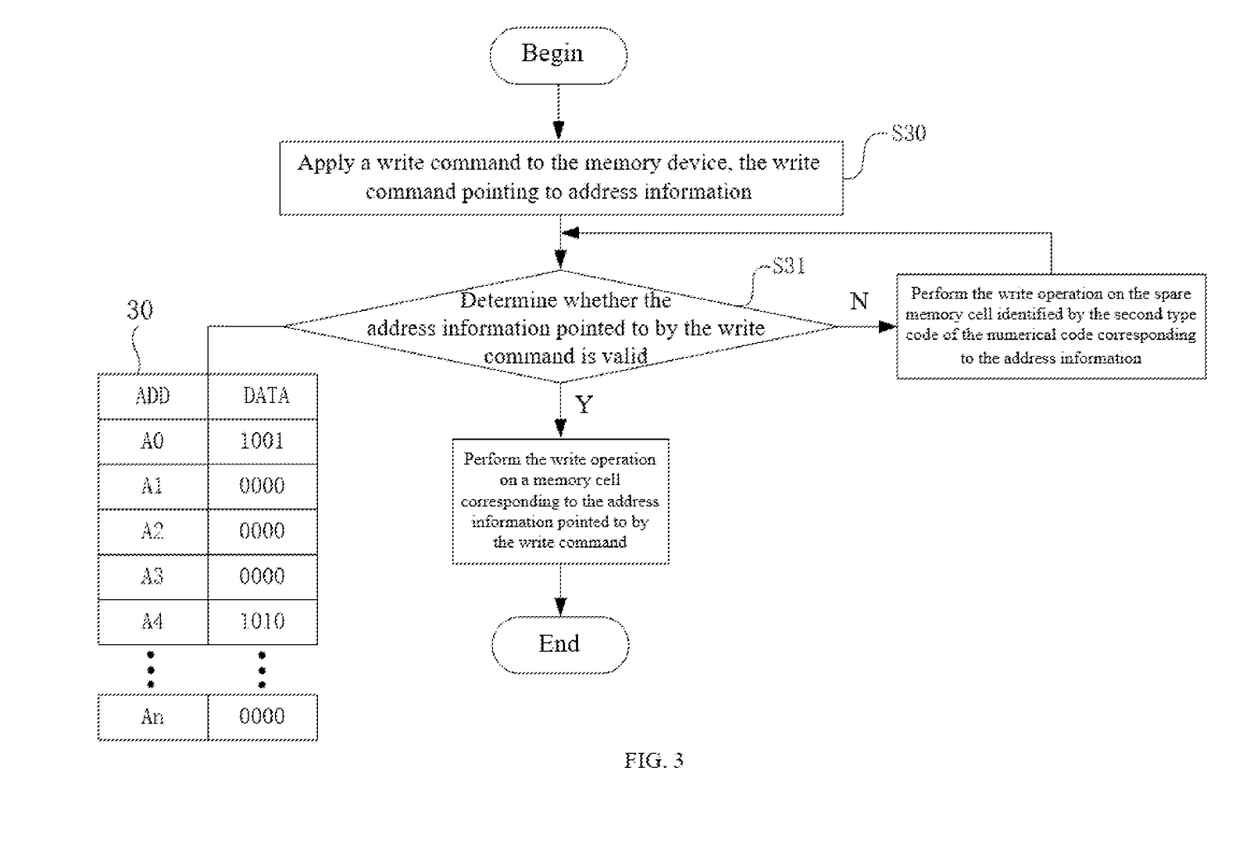
FIG. 3 is a schematic flow diagram of a method for reading and writing according to a third embodiment of the present disclosure.

In Step S30, a write command is applied to the memory device, wherein the write command points to address information. For example, a write command is applied to the memory device, wherein the write command points to address information A0.

In Step S31, it is determined whether the address information pointed to by the write command is valid.

In this embodiment, a mark corresponding to the address information is looked up from the lookup table by taking the address information pointed to by the write command as an index, to determine whether the address information pointed to by the write command is valid based on the mark.

For example, if the write command points to the address information A0, the first type code of the numerical code corresponding to the address information A0 is looked up from the lookup table 30 by taking the address information A0 pointed to by the write command as an index, to determine whether the address information A0 pointed to by the write command is valid based on the first type code. For another example, if the write command points to the address information A1, the first type code of the numerical code corresponding to the address information A1 is looked up from the lookup table 30 by taking the address information A1 pointed to by the write command as an index, to determine whether the address information A1 pointed to by the write command is valid based on the first type code.

A write operation is performed on a memory cell corresponding to the address information pointed to by the write command if the mark of the address information pointed to by the write command is valid. It is stopped performing the write operation on the memory cell corresponding to the address information pointed to by the write command if the first type code of the numerical code corresponding to the address information pointed to by the write command is the invalid marked value. In this case, the second type code of the numerical code is identified, and the write operation is performed on the spare memory cell identified by the second type code.

For example, in the lookup table 30, if the first type code of the numerical code corresponding to the address information A0 pointed to by the write command is the invalid marked value 1, it is stopped performing the write operation on the memory cell corresponding to the address information A0 pointed to by the write command, the second type code 001 of the numerical code is identified, and the write operation is performed on the spare memory cell identified by the second type code 001. For another example, in the lookup table 30, if the first type code of the numerical code corresponding to the address information A1 pointed to by the write command is the valid marked value 0, the write operation is performed on the memory cell corresponding to the address information A1 pointed to by the write command.

Further, in another embodiment of the present disclosure, the numerical code also may be only composed of the second type code. That is, the numerical code only includes the identification code configured for identifying the spare memory cell or the meaningless code. When applying a write command to the memory device, the numerical code is looked up from the lookup table 30 by taking the address information pointed to by the write command as an index. In the lookup table 30, if the numerical code corresponding to the address information pointed to by the write command is the meaningless code, this means that the memory cell corresponding to the address information pointed to by the write command is valid. In this case, the write operation is performed on the memory cell. If the numerical code corresponding to the address information pointed to by the write command is the identification code, this means that the memory cell corresponding to the address information pointed to by the write command is invalid. In this case, the write operation is performed on the spare memory cell corresponding to the identification code.

Further, in this third embodiment, the method for reading and writing also includes: forming a second ECC corresponding to data to be written in the write operation, and writing the second ECC together with the data to be written into the memory cell corresponding to the address information pointed to by the write command. When reading data in the memory cell, both the data and the second ECC are read simultaneously, and the second ECC is decoded to restore data where an error likely occurs.

In this third embodiment, according to the method for reading and writing provided by the present disclosure, after a write command is applied to the memory device, it is determined whether the address information pointed to by the write command is valid. If the address information is determined as invalid, the write operation is performed on the spare memory cell corresponding to the address information instead of the invalid memory cell. In this way, the reliability of the memory device is improved, and the lifespan of the memory device is prolonged.

The present disclosure also provides a memory device that can implement the above method for reading and writing. The memory device includes, but is not limited to, a volatile memory such as a dynamic random access memory (DRAM) and a static random access memory (SRAM), and a non-volatile memory such as an NAND flash memory, an NOR flash memory, a ferroelectric random access memory (FeRAM), a resistance random access memory (RRAM), a magnetic random access memory (MRAM), and a phase change random access memory (PCRAM), etc.

Figure 4:
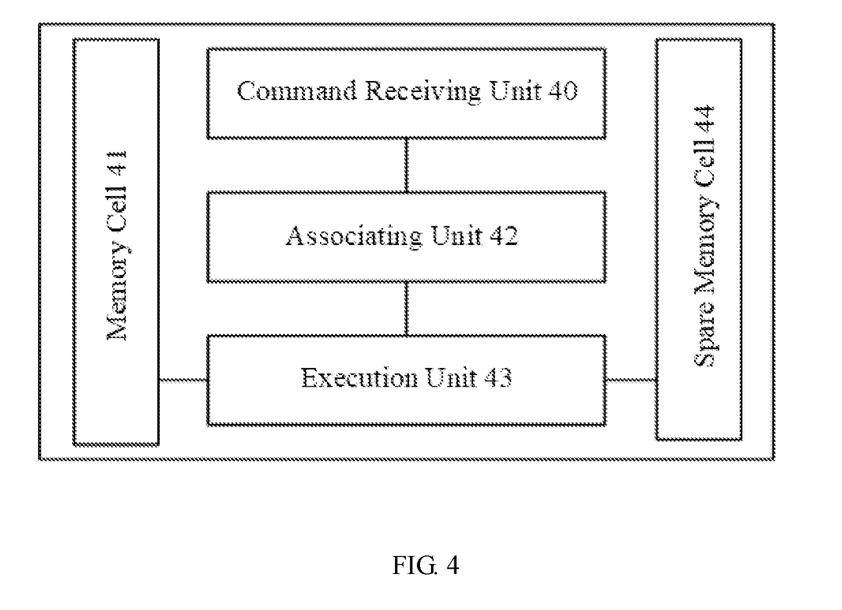
FIG. 4 is a schematic structural diagram of a memory device according to a first embodiment of the present disclosure.

With reference to FIG. 4, a schematic structural diagram of a memory device according to a first embodiment of the present disclosure is illustrated. The memory device includes: a command receiving unit 40, a memory cell 41, an associating unit 42, an execution unit 43, and a spare memory cell 44.

The command receiving unit 40 is configured to receive a read/write command applied to the memory device, or address information pointed to by the read/write command.

The memory cell 41 corresponds to the address information pointed to by the read/write command, and is configured to store data. In the present disclosure, the memory cell 41 may be a memory unit well known to those skilled in the art, such as a basic memory cell, a memory segment, memory pages, and memory blocks, which are not limited by the present disclosure.

The associating unit 42 is configured to associate the address information with the spare memory cell 44. In this embodiment, the associating unit 42 is also configured to store mark information configured for recording whether the address information is valid or invalid. In some embodiments, in this embodiment, the associating unit 42 is a lookup table. Address information of the memory cell 41 and a numerical code corresponding to the address information are recorded in the lookup table. The numerical code is composed of a first type code and a second type code, wherein the first type code is configured for marking whether the address information is valid, and the second type code is configured for recording an identification code of the spare memory cell 44. If an error occurs in the data to be read out, in the lookup table, the first type code of the numerical code corresponding to the address information pointed to by the read command is revised as the invalid marked value, and the second type code is revised as the identification code configured for identifying the spare memory cell 44.

The execution unit 43 is configured to perform a read/write operation on the memory cell 31. The execution unit is also connected to the associating unit 42, and the execution unit is configured to perform a read/write operation on the memory cell 41 corresponding to the address information, or to stop performing the read/write operation on the memory cell 41 corresponding to the address information according to mark information of the associating unit 42. In some embodiments, if the first type code of the numerical code corresponding to the address information pointed to by the read/write command is the valid marked value, the execution unit 43 performs the read/write operation on the memory cell corresponding to the address information. However, if the first type code of the numerical code corresponding to the address information pointed to by the read/write command is the invalid marked value, the execution unit 43 stops performing the read/write operation on the memory cell corresponding to the address information, and performs the read/write operation on the spare memory cell identified by the second type code according to the second type code of the numerical code.

The spare memory cell 44 corresponds to the address information pointed to by the read/write command through the second type code, and is configured to store data. In the present disclosure, the spare memory cell 44 may be a memory unit well known to those skilled in the art, such as a basic memory cell, a memory segment, memory pages, and memory blocks, which are not limited by the present disclosure.

It is to be noted that in other embodiments, the associating unit 42 may be merely connected to the execution unit 43, and the command receiving unit 40 may be directly connected to the execution unit 43. The present disclosure does not limit this connection mode, and those of ordinary skill in the art may set to implement the above functions as required.

Figure 5:
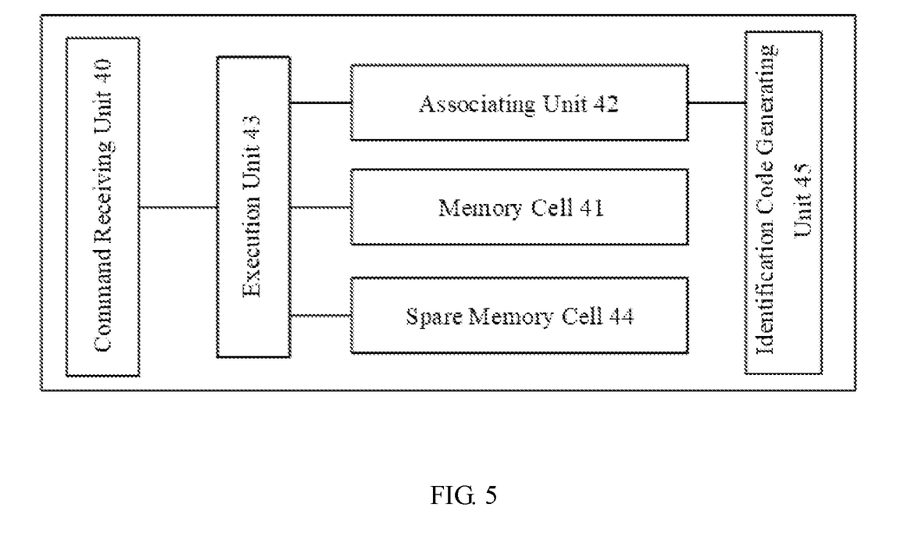
FIG. 5 is a schematic structural diagram of a memory device according to a second embodiment of the present disclosure.

Further, the memory device of the present disclosure also provides a second embodiment. With reference to FIG. 5, a schematic structural diagram of the memory device according to the second embodiment of the present disclosure is illustrated. The second embodiment differs from the first embodiment in that the memory device also includes an identification code generating unit 45. The identification code generating unit 45 is configured to generate an identification code configured for identifying the spare memory cell. The identification code generating unit 45 is connected to the associating unit 42, and the associating unit 42 can revise the second type code of the numerical code as the identification code generated by the identification code generating unit 45. Further, the identification code generating unit 45 can record the number of times of revising the second type code of the numerical code in the associating unit 42, to generate the identification code according to the number of times of revising the second type code.

The associating unit 42 associates the address information with the spare memory cell 44 through the identification code, such that the execution unit 43 can perform the read/write operation on the spare memory cell 44.

Figure 6:
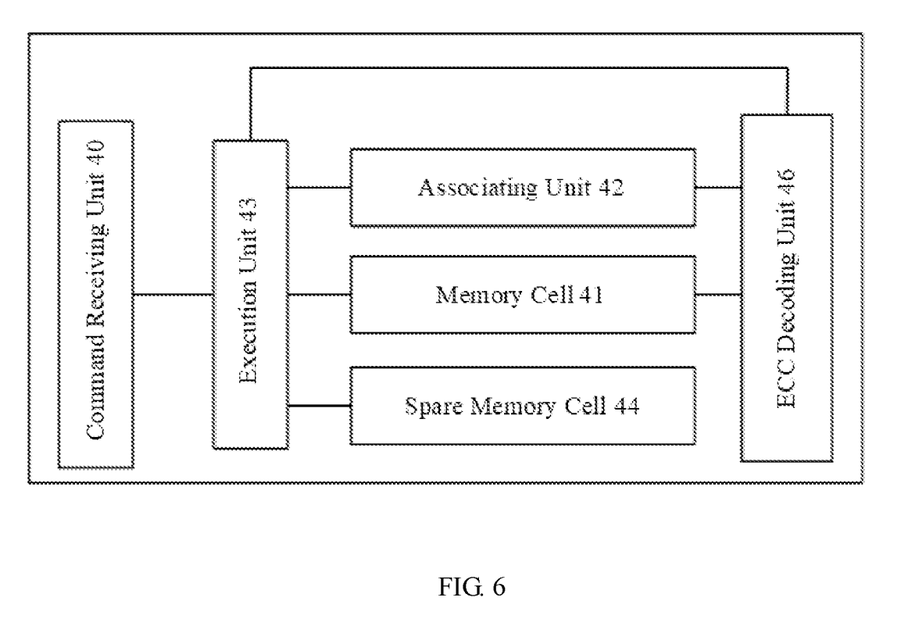
FIG. 6 is a schematic structural diagram of a memory device according to a third embodiment of the present disclosure.

Further, the memory device of the present disclosure also provides a third embodiment. With reference to FIG. 6, a schematic structural diagram of the memory device according to a third embodiment of the present disclosure is illustrated. The third embodiment differs from the first embodiment in that the memory device also includes an ECC decoding unit 46.

The ECC decoding unit 46 is connected to the execution unit 43, the memory cell 41, and the associating unit 42.

The ECC decoding unit 46 is configured to decode the first ECC corresponding to the data to be read out in the read operation to restore data where an error likely occurs. Furthermore, the numerical code of the associating unit 42 may be revised based on a fact whether the ECC decoding unit 46 restores the data. The ECC decoding unit 46 is also configured to form a second ECC corresponding to data to be written in the write operation.

In some embodiments, in this embodiment, the command receiving unit receives a write command. When performing the write operation on the memory cell corresponding to the address information pointed to by the write command, the ECC decoding unit 46 forms an ECC corresponding to data to be written in the write operation, and stores the ECC into the memory cell 41 corresponding to the address information pointed to by the write command. After the write operation is completed, when a subsequent read operation is performed on the memory cell corresponding to the address information, the ECC decoding unit 46 decodes the ECC. It may be determined whether an error occurs in the data to be read out read by the read operation according to decoding of the ECC decoding unit 46, and then the numerical code of the associating unit 42 is revised.

Further, in this embodiment, it may be determined whether to revise the numerical code of the associating unit 42 based on a fact whether the ECC decoding unit 46 restores the data. In some embodiments, if the ECC decoding unit 46 decodes the ECC and restores the data, this means that an error occurs in the data to be read out read by the read operation. In this case, the numerical code corresponding to the address information of the memory cell is revised as a combination of the invalid marked value and the identification code in the associating unit 42. If the ECC decoding unit 46 decodes the ECC, but does not restore the data, this means that no error occurs in the data to be read out read by the read operation. In this case, the numerical code corresponding to the address information is revised as a combination of the valid marked value and the meaningless code in the associating unit 42, or the initial mark of the numerical code corresponding to the address information is retained.

In other embodiments of the present disclosure, the ECC decoding unit 46 decodes the ECC. Although the ECC decoding unit 46 does not restore the data, it may be still determined that an error occurs in the data to be read out read by the read operation according to decoding of the ECC decoding unit 46. In this case, the numerical code corresponding to the address information of the memory cell is revised as a combination of the invalid marked value and the identification code in the associating unit 42.

Figure 7:
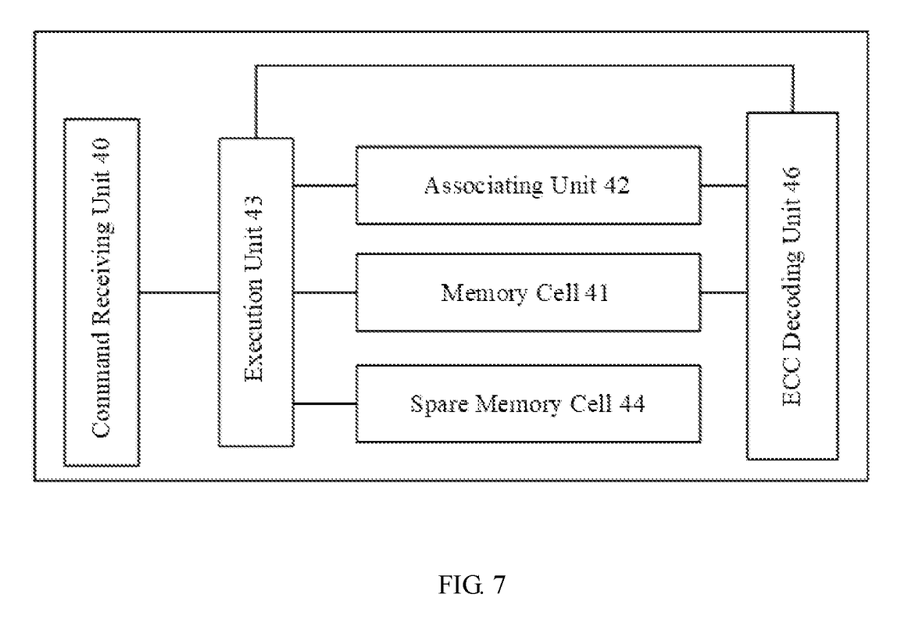
FIG. 7 is a schematic structural diagram of a memory device according to a fourth embodiment of the present disclosure.

In the third embodiment, the execution unit 43 not only is connected to the ECC decoding unit 46, but also is connected to the memory cell 41. However, in a fourth embodiment of the present disclosure, with reference to FIG. 7, a schematic structural diagram of the memory device according to the fourth embodiment, the execution unit 43 is connected to the ECC decoding unit 46, and the ECC decoding unit 46 is further connected to the memory cell 41. It is to be understood that different connection relationships may be selected according to different needs.

Figure 8:
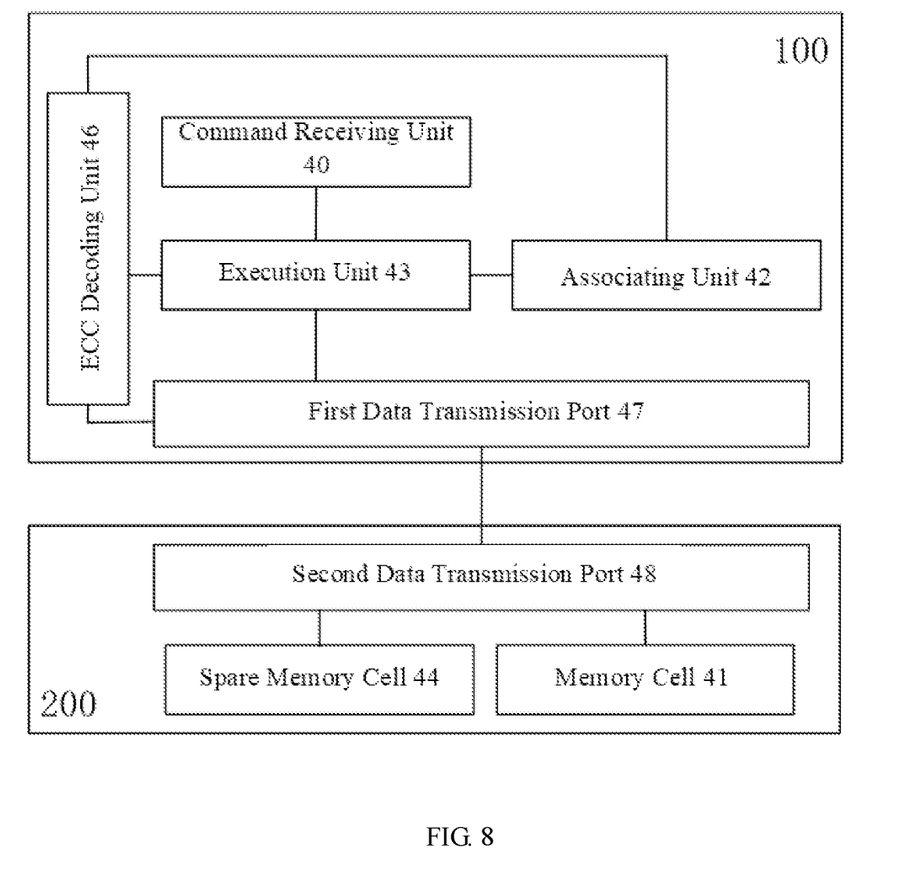
FIG. 8 is a schematic structural diagram of a memory device according to a fifth embodiment of the present disclosure.

The memory device of the present disclosure also provides a fifth embodiment. With reference to FIG. 8, a schematic structural diagram of the memory device according to a fifth embodiment of the present disclosure is illustrated. The fifth embodiment differs from the third embodiment in that the memory device also includes a logic layer 100 and a plurality of memory layers 200 (only one memory layer is shown in FIG. 8). The plurality of memory layers 200 may be DRAM chips, and the logic layer 100 may be a layer provided with a logic circuit, such as a control chip or an interposer. The plurality of memory layers 200 may be vertically stacked above or below the logic layer 100, but the present disclosure is not limited thereto. Furthermore, the plurality of memory layers 200 may be integrated together using other packaging methods.

The command receiving unit 40, the associating unit 42, the execution unit 43 and the ECC decoding unit 46 may be arranged in the logic layer 100. The memory cell 41 and the spare memory cell 44 are arranged in the first memory layer 200. In another embodiment of the present disclosure, the associating unit 42 and the ECC decoding unit 46 may also be arranged in the first memory layer 200.

In this embodiment, the logic layer 100 has at least one first data transmission port 47, and the first memory layer 200 has at least one second data transmission port 48. Instructions and data are transmitted between the logic layer 100 and the plurality of memory layers 200 through the first data transmission port 47 and the second data transmission port 48.

Figure 9:
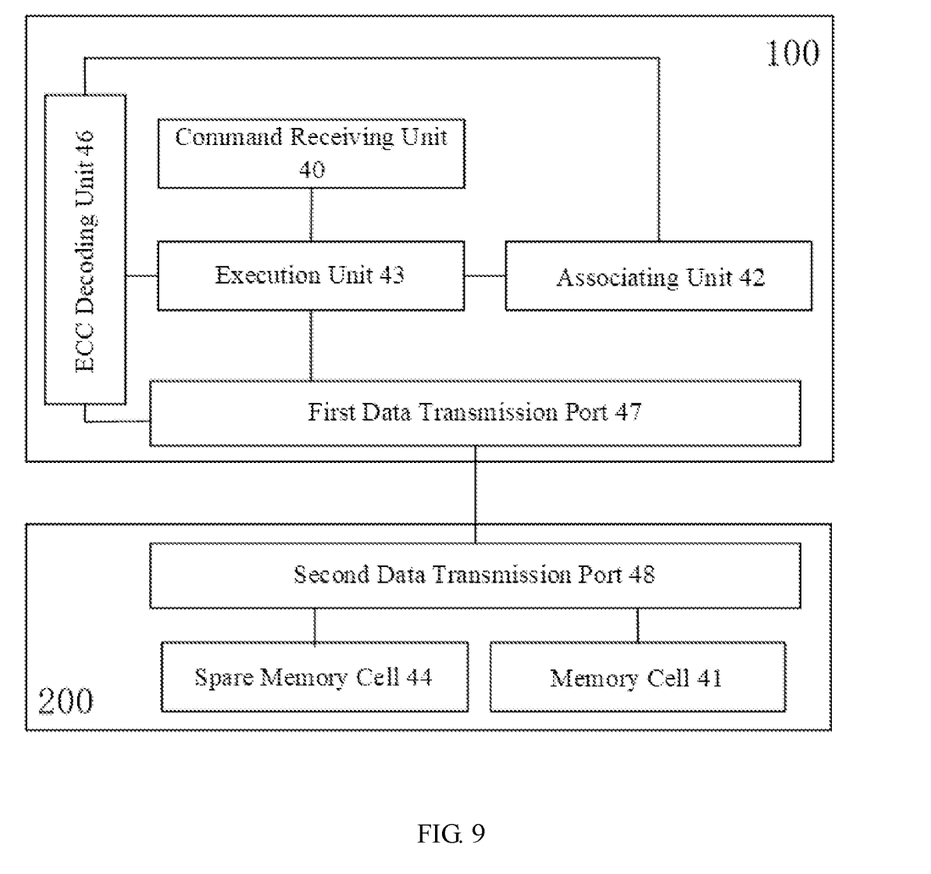
FIG. 9 is a schematic structural diagram of a memory device according to a fifth embodiment of the present disclosure.

Further, in the fifth embodiment, the execution unit 43 not only is connected to the ECC decoding unit 46, but also is connected to the memory cell 41 through the first data transmission port 47 and the second data transmission port 48. However, in the fifth embodiment of the present disclosure, with reference to FIG. 9, a schematic structural diagram of the memory device according to the fifth embodiment, the execution unit 43 is connected to the ECC decoding unit 46, and the ECC decoding unit 46 is connected to the memory cell 41 through the first data transmission port 47 and the second data transmission port 48. It is to be understood that different connection relationships may be selected according to different needs.

What is mentioned above merely refers to some embodiments of the present disclosure. It is to be pointed out that to those of ordinary skill in the art, various improvements and embellishments may be made without departing from the principle of the present disclosure, and these improvements and embellishments are also deemed to be within the scope of protection of the present disclosure.

What is claimed is:
1. A method for reading and writing, comprising:
applying a read command to a memory device, the read command pointing to address information;

reading data to be read out from a memory cell corresponding to the address information pointed to by the read command;

associating the address information pointed to by the read command with a spare memory cell if an error occurs in the data to be read out;

generating an identification code configured for identifying the spare memory cell, wherein the address information pointed to by the read command is associated with the spare memory cell through the identification code; and marking the address information pointed to by the read command as invalid if the error occurs in the data to be read out;

wherein address information not marked as invalid is initially set as valid;

wherein the reading data to be read out from a memory cell corresponding to the address information pointed to by the read command further comprises:

reading, from the memory cell corresponding to the address information pointed to by the read command, a first error correction code (ECC) corresponding to the data to be read out; and wherein a method for determining whether an error occurs in the data to be read out comprises: decoding the first ECC to determine whether the error occurs in the data to be read out.

2. The method for reading and writing according to claim 1, further comprising: marking the address information pointed to by the read command as valid if no error occurs in the data to be read out.

3. The method for reading and writing according to claim 1, comprising:

providing a lookup table, wherein address information of the memory cell and a numerical code corresponding to the address information are recorded in the lookup table, the numerical code being composed of a first type code and a second type code, the first type code being configured for marking whether the address information is valid, and the second type code being configured for recording the identification code of the spare memory cell; and revising, in the lookup table, the first type code of the numerical code corresponding to the address information pointed to by the read command as an invalid marked value if the error occurs in the data to be read out, and revising the second type code as the identification code configured for identifying the spare memory cell.

4. The method for reading and writing according to claim 3, further comprising: recording number of times of revising the second type code, and generating the corresponding identification code according to the number of times of revising the second type code.

5. The method for reading and writing according to claim 3, wherein the numerical code has an initial value, in the initial value, the first type code being a valid marked value, and the second type code being a meaningless code.

6. The method for reading and writing according to claim 3, comprising:

applying a write command to the memory device;

performing a write operation on a memory cell corresponding to address information pointed to by the write command if a mark of the address information pointed to by the write command is valid; and stopping performing the write operation on the memory cell corresponding to the address information pointed to by the write command if the mark of the address information pointed to by the write command is invalid, and performing the write operation on the spare memory cell identified by the identification code corresponding to the address information pointed to by the write command.

7. The method for reading and writing according to claim 6, wherein when applying the write command to the memory device, the numerical code is looked up from the lookup table by taking the address information pointed to by the write command as an index.

8. The method for reading and writing according to claim 6, wherein the performing a write operation on a memory cell corresponding to address information pointed to by the write command further comprises:

forming a second ECC corresponding to data to be written in the write operation, and writing the second ECC together with the data to be written into the memory cell corresponding to the address information pointed to by the write command.

9. The method for reading and writing according to claim 3, wherein after the applying a read command to the memory device, and before the reading data to be read out from a memory cell corresponding to the address information pointed to by the read command, the method further comprises:

determining whether the address information pointed to by the read command is valid;

performing a read operation on the memory cell corresponding to the address information pointed to by the read command if the address information pointed to by the read command is valid; and stopping performing the read operation on the memory cell corresponding to the address information pointed to by the read command if a mark of the address information pointed to by the read command is invalid, and performing the read operation on the spare memory cell identified by the identification code corresponding to the address information pointed to by the read command.

10. The method for reading and writing according to claim 1, further comprising: storing, when the error occurs in the data to be read out, corrected data into the spare memory cell if the data to be read out is corrected; and storing the data to be read out into the spare memory cell if the data to be read out is not corrected.

11. A memory device, comprising:

a command receiving unit, configured to receive a read/write command;

a memory cell, configured to correspond to address information pointed to by the read/write command;

a spare memory cell;

an associating unit, configured to associate the address information with the spare memory cell;

an execution unit, configured to perform a read/write operation on the memory cell or the spare memory cell; and an identification code generating unit connected to the associating unit, wherein the identification code generating unit is configured to generate an identification code configured for identifying the spare memory cell, the associating unit being configured to associate the address information with the spare memory cell through the identification code;

wherein the associating unit is further configured to store mark information configured for recording whether the address information is valid or invalid;

wherein the associating unit is a lookup table, address information of the memory cell and a numerical code corresponding to the address information being recorded in the lookup table;

wherein the numerical code is composed of a first type code and a second type code, the first type code being configured for marking whether the address information is valid, and the second type code being configured for recording the identification code of the spare memory cell; and wherein if an error occurs in data to be read out, the first type code of the numerical code corresponding to the address information pointed to by the read command is revised as an invalid marked value in the lookup table, and the second type code is revised as the identification code configured for identifying the spare memory cell.

12. The memory device according to claim 11, further comprising an ECC decoding unit, wherein the ECC decoding unit is configured to decode a first ECC corresponding to data to be read out in the read operation and to form a second ECC corresponding to data to be written in the write operation.

13. The memory device according to claim 11, wherein the execution unit is further connected to the associating unit, and the execution unit being configured to perform a read/write operation on the memory cell corresponding to the address information or on the spare memory cell, or to stop performing the read/write operation on the memory cell corresponding to the address information, based on record of the associating unit.

* * * * *